United States Patent
Clark et al.

(10) Patent No.: US 7,265,856 B1
(45) Date of Patent: Sep. 4, 2007

(54) METHOD AND SYSTEM FOR RECEIVING AND PROCESSING MULTIPLE COMPRESSED PRINT DATA STREAMS

(75) Inventors: Heather Laudan Clark, Lexington, KY (US); Duane Edward Norris, Lexington, KY (US)

(73) Assignee: Lexmark International Inc., Lexington, KY (US)

( * ) Notice: Subject to any disclaimer, the term of this patent is extended or adjusted under 35 U.S.C. 154(b) by 827 days.

(21) Appl. No.: 09/813,681

(22) Filed: Mar. 21, 2001

(51) Int. Cl.
 *G06K 15/00* (2006.01)
 *G06F 13/00* (2006.01)
(52) U.S. Cl. .................. 358/1.15; 358/1.18; 358/1.16; 358/1.7; 382/232
(58) Field of Classification Search ................ 358/1.1, 358/1.2, 1.3, 1.4, 1.5, 1.6, 1.7, 1.8, 1.9, 1.11, 358/1.12, 1.13, 1.14, 1.15, 1.16, 1.17, 1.18, 358/426.04, 426.06, 470, 502; 382/232, 382/233, 244, 248; 400/61, 76; 713/160; 369/47.27
See application file for complete search history.

(56) References Cited

U.S. PATENT DOCUMENTS

| | | | |
|---|---|---|---|
| 4,463,374 A * | 7/1984 | Thompson .................. 358/530 |
| 4,553,206 A * | 11/1985 | Smutek et al. ............... 707/101 |
| 4,651,278 A * | 3/1987 | Herzog et al. .............. 358/1.18 |
| 5,155,484 A * | 10/1992 | Chambers, IV ............... 341/55 |
| 5,168,552 A | 12/1992 | Vaughn et al. |
| 5,515,479 A | 5/1996 | Klassen |
| 5,553,160 A * | 9/1996 | Dawson ...................... 382/166 |
| 5,592,683 A * | 1/1997 | Chen et al. .................... 710/52 |
| 5,672,016 A | 9/1997 | Miyano |
| 5,708,762 A | 1/1998 | Chiba et al. |
| 5,805,184 A | 9/1998 | Horiike |
| 5,933,576 A | 8/1999 | Muramatsu |
| 5,963,713 A | 10/1999 | Inose et al. |
| 5,978,553 A | 11/1999 | Ikeda |
| 6,002,847 A | 12/1999 | Silverbrook |
| 6,097,498 A * | 8/2000 | Debry et al. ................ 358/1.13 |
| 6,963,668 B2 * | 11/2005 | Engeldrum et al. ......... 382/233 |

* cited by examiner

*Primary Examiner*—King Y. Poon
(74) *Attorney, Agent, or Firm*—Needle & Rosenberg PC

(57) ABSTRACT

A system and method for transmitting multiple data streams from a host to a printing device. Data streams are arranged according to color, segmented and compressed, if desired. If compression is used, each segment may compressed with a different compression algorithm. Each segment contains a header describing the size of the data in the segment. The host transmits a print header containing information and instructions necessary for the print device to reassemble and process the data segments to produce a printed item.

32 Claims, 12 Drawing Sheets

METHOD AND SYSTEM FOR RECEIVING AND PROCESSING MULTIPLE COMPRESSED PRINT DATA STREAMS

BACKGROUND OF THE INVENTION

1. Field of the Invention

The present invention is generally directed to receiving and processing segmented data streams sent from a host to a printing device. More particularly, the invention relates to transmitting, receiving and processing multiple data streams from a host to a color capable printer, such as an inkjet printer, with each stream containing data relating to a different color.

2. The Prior Art

Inkjet printers produce printed items by printing horizontal components called swaths. Swaths may be further divided into vertical segments called slices, each slice being a vertical bar of single dots. A swath is produced by one or more printheads. Printheads are typically mounted on a carriage that passes across the surface of the printing medium, allowing the printhead(s) to apply ink to the printing medium surface. The part of the printhead that applies a particular color ink is known as a colorhead.

Current inkjet printers operate using a method where host software sends a print command to the printer for a particular swath. The command contains one complete piece of data for that swath, in either compressed or uncompressed form. A command header instructs the printer as to which printhead to use, where to start printing on the page, how many slices to print, the print mode to use, and the data that is to be sent to the printhead through the application specific integrated circuit (ASIC).

This current method of printing is effective when only one printhead is used at a time, because the host software is only required to send one stream of print data to the printer. This single data stream contains data needed to produce the swath, including data for all three primary colors of ink (cyan, magenta, and yellow) that are used to produce the array of colors that appear on a printed item. However, advances in the field of inkjet printers and other printing devices have created the need for a method of efficiently sending, receiving and processing multiple streams of print data.

Next generation inkjet printing devices utilize multiple printheads during the color scan that produces each swath. For purposes of these printers, it is advantageous to split the print data into distinct streams for transmission from the host to the printer. Specifically, the data is split such that each stream contains all the print data for a particular one of the three primary colors—cyan, magenta and yellow—that are used in color printing.

Splitting the data for each primary color requires an efficient process for reassembling the data to produce the array of colors to be printed on the printing medium. Problems with reassembly arise in that each data stream may contain unequal amounts of information. For example, the printhead does not need to apply each color of ink continuously as it moves across the page. A swath may be exclusively yellow for some portion, then cyan-yellow, and then cyan-magenta. If the printheads are supplied with different amounts of data for each color of ink, the system must be able to determine at what points on the page to apply each color, otherwise the printhead may not apply each color at the correct points on the page. Padding the data streams with placeholder or dummy data to create streams of equivalent size is ineffective. Sending equal amounts of data to each printhead would force the data streams to be padded with zeroes, which would significantly increase the size of the data stream sent to the printer. The printer would then be required to house enough memory to accommodate the larger data stream size, which in turn significantly increases cost. Furthermore, padding the data streams would substantially increase the volume of data traffic across the printer port. Many printing systems utilize data compression techniques as a means of managing print data. However, if printer firmware performs the decompression of received print data, simply compressing the data before transmitting it to the printer may still require the printer to have significant memory resources. This is because the printer must buffer the compressed data during decompression and also store the decompressed data for later processing.

It is therefore desirable to manage multiple compressed data streams for each printhead in a manner such that they can be decompressed and arranged to properly print a swath while simultaneously minimizing the amount of printer memory required.

SUMMARY OF THE INVENTION

According to the present invention, a method and system are provided for sending segmented streams of compressed print data to an inkjet printer, decompressing the data, and arranging the data such that multiple printheads can properly print a swath.

Host software separates the print data by primary color, divides the print data into segments, compresses the data if desired, and sends the segments to the printer. The segment contains only print data—no padding. This reduces the amount of printer memory needed to store print data to a size that accommodates the largest swath. In addition to print data, each segment contains a header that describes the size of the data in compressed and/or uncompressed form. Firmware resident in the printer memory allocates the segments to the printer's available memory according to size to prevent fragmentation of printer memory. Data is then decompressed by either printer firmware or hardware. After decompression, data is arranged by the printer firmware to properly print a swath.

Correct ordering of the data associated with a swath is achieved by sending a print header that contains information such as which head to use, where to start printing on the page, how many slices to print, the print mode, etc. Accompanying this information is a map describing the order in which the segments of data will be sent to the printer. The print header also contains information about the relative positions of the colors to be printed. By using this information, the firmware determines when to start firing the printhead and when to send the print data to each color head on the printhead.

Each segment of data also contains a small header that describes the size (compressed and/or uncompressed) of the data being sent and the compression scheme employed if compression is used. This allows segments to be re-sent in the event they become corrupted, and further allows the use of different compression schemes across different data segments to improve system efficiency.

According the present invention, organization and decompression of data segments received by the printer is done by as many as three tasks in the printer software—a transform task, a command handler, and a decompression task. If the decompression is performed by printer hardware, the decompression software task is not needed and only the transform task and command handler are employed. The transform task receives the print header and passes the appropriate information to the command handler. The command handler then waits for all of the data to be received and decompressed. As each segment is received by the link, it is stored in a memory buffer. The transform task allocates a memory partition for the decompressed data and sends a message to either the decompression task or printer hardware, asking for the data to be decompressed. When the decompression task is finished with each segment, it sends a message to the command handler informing it that the data is available. Then, based on information from the print header, the command handler assembles the data and starts the printing process.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set herein; rather, applicant provides this embodiment so that this disclosure will be thorough and complete, and will fully convey the scope of the invention to those skilled in the art. Like numbers refer to like elements throughout.

Figure 1:
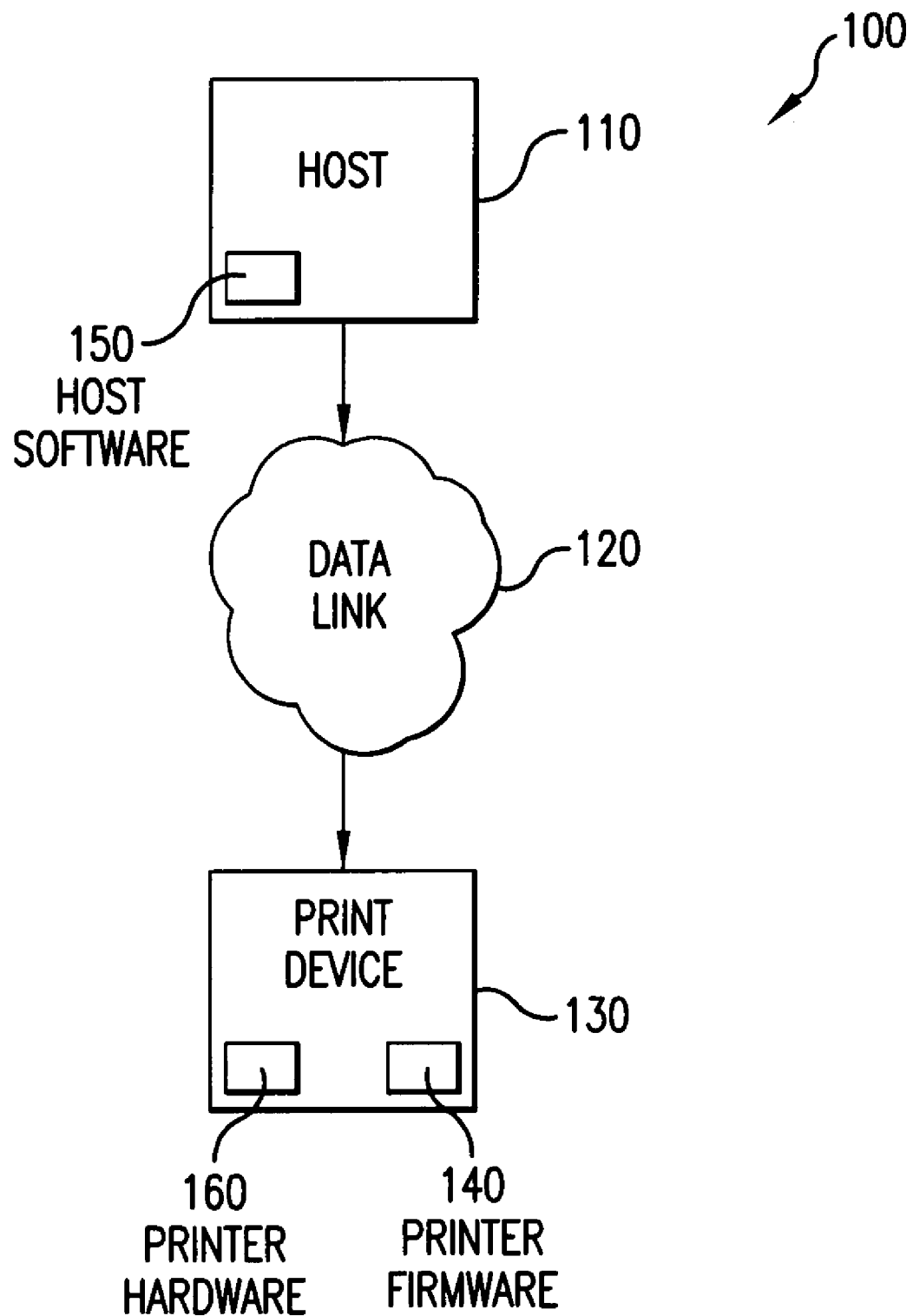
FIG. 1 is an illustration of a printing system according to the present invention.

Referring now to FIG. 1, a block diagram of a system for transmitting and processing multiple print data streams according to the present invention will be described. The system 100 comprises a host 110 on which host software 150 is resident. The host 110 can be a stand-alone personal computer (PC), a print server, or other types of networked computers. Host software 150 performs pre-processing of the print data and directs transmission of the data through the data link 120 to the print device 130. The data link 120 may be a universal serial bus (USB) or any other known means of linking hardware devices for data transmission. The print device 130 may be an inkjet printer or other type of printing device. The print device 130 contains firmware 140 and hardware 160, which further processes print data received from the host 110 to enable the print device 130 to produce a printed item, such as a multi-color graph or plain text document. The manner in which the components 110, 120, 130, 140, 150 and 160 of system 100 may be assembled is well known and will not be described further.

Figure 2:
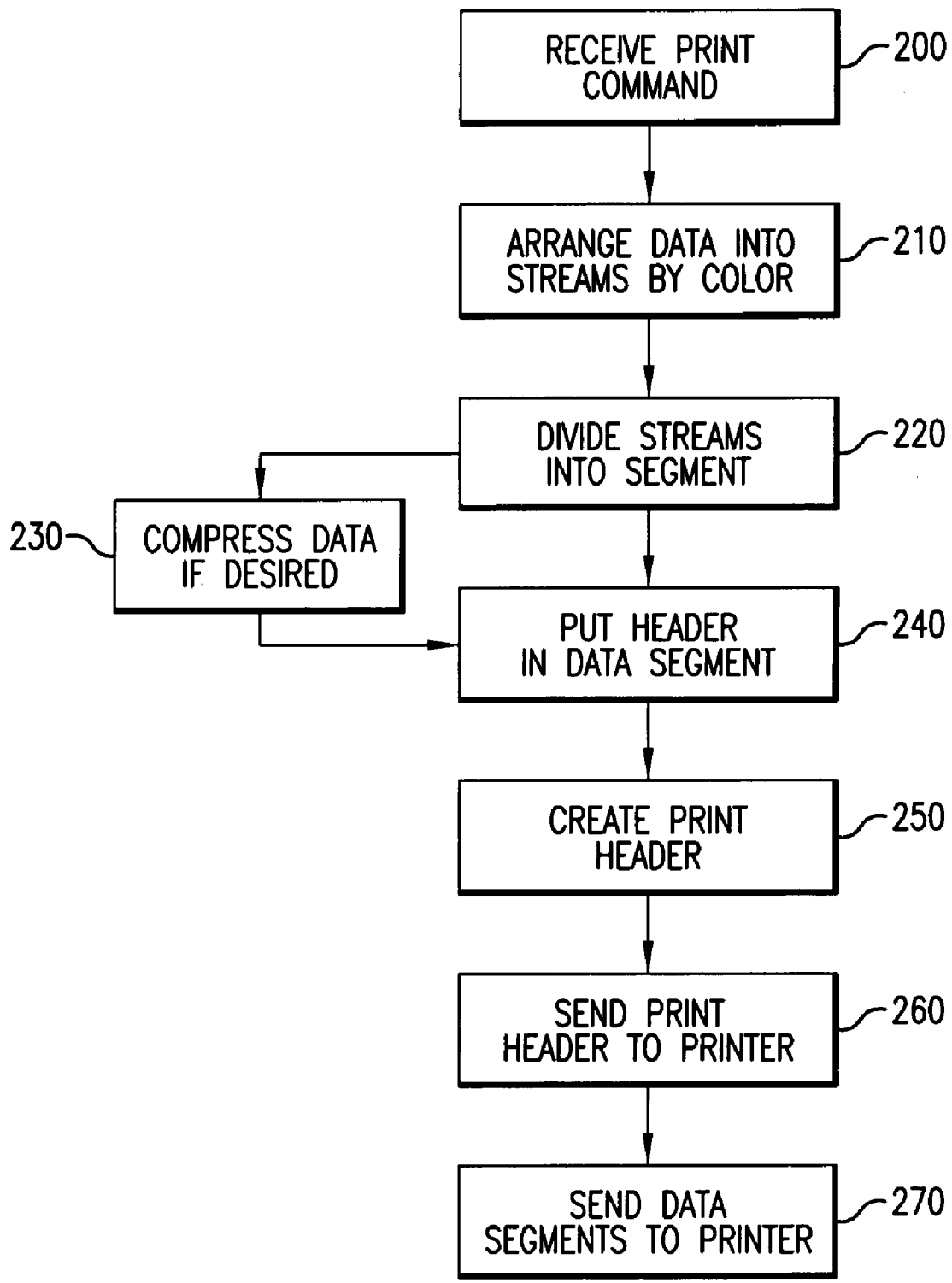
FIG. 2 is a flow chart describing functions performed by host software in a printing system according to the present invention.

Referring now to FIG. 2, the processing tasks performed by the host software 150 according the present invention will now be described. First, host software 150 receives a command to send print data to the print device as shown at step 200. The host software determines which colors will be used during the printing process and separates print data out by color at step 210, so that all the data for each color will be transmitted in a different data stream. For example, where the print device 130 is an inkjet printer that uses cyan, yellow and magenta inks, the host software 150 would divide the print data into a separate data stream for each of cyan, yellow and magenta.

The print data in each stream is then further divided into smaller segments at step 220. The host software 150 then uses a compression algorithm to compress each data segment at step 230. The compression of the data segments at step 230 can be performed using a single compression algorithm for each segment, or alternatively host software 150 can employ multiple compression algorithms, the compression algorithm for each segment being selected by the host software 150 so as to maximize system efficiency and performance. Those in the art will understand that the method and system of the present invention may be employed without compressing the individual data segments. In such a case, the functionality of the system that is directed towards handling compressed data segments is simply not used and the uncompressed data segments are treated as decompressed data segments would be by the other components of the system.

Additionally, many compression algorithms are known by those in the art, and it will be understood that any of those compression algorithms may be employed at a step 230.

Host software then creates a header for each compressed data segment at step 240. The header describes the size of the data in compressed and uncompressed form, and that information is later used by the printer firmware 140 to further process the data.

A print header, which contains additional information used by the printer firmware 140 to process the print data, is created at step 250. The print header may contain information such as where the print device should start printing on a page, which printhead(s) should be used, how many slices to print in a swath, the print mode and many other types of information. In a preferred embodiment of the present invention, the print header will contain a map detailing the order in which the segments of print data will be transmitted from the host 110 to the print device 130. This type of print header gives the host software 150 complete control over the ordering of the data segments. For example, the host software 150 may build data streams for colors cyan, magenta and yellow simultaneously, in which data segments representing each color could be sent in alternating fashion—cyan, magenta, yellow, cyan, magenta, yellow, etc. In another instance, the print software may be called on to print a swath that is predominantly yellow, in which case all the print data for yellow could be sent to the print device 130, followed by the data for the remaining colors.

After the segmentation, compression and ordering information is determined by the host software 150, the print header is then sent to the print device 130 at step 260, followed by the data segments at step 270. The data segments may be sent to the print device in many different sequences for any particular print job. Ordering of segments for transmission is independent of the color composition of each swath and the direction (left to right or right to left). The following examples demonstrate how the segment ordering could be handled for a variety of printing situations.

Figure 3:
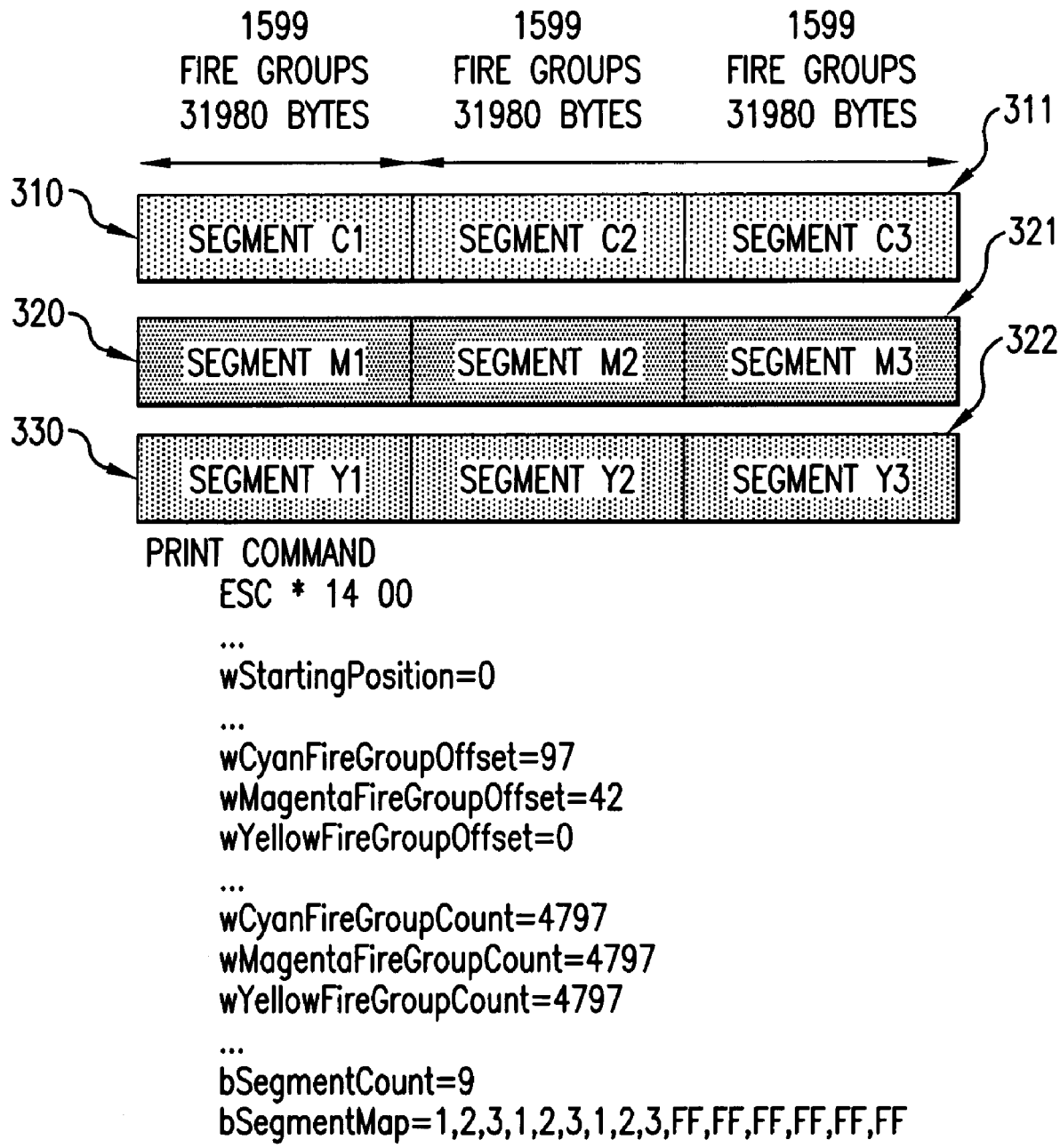
FIG. 3 is an illustration of full data streams containing equal amounts of data according to the present invention.

Referring now to FIG. 3, a diagram illustrates the ordering of segments for three data streams, a cyan data stream 310, a magenta data stream 320 and yellow data stream 330, that contain all the color data needed to produce a "full" swath. Each data stream is full in that the swath that is to be printed requires the application of each color throughout the width of the swath. Individual data segments 311, 321 and 331 are equal in size, and data streams 310, 320 and 330 are each composed of three such segments. Printing a swath of this type presents minimal difficulty in ordering the swaths for transmission and reassembly by the printer firmware 140. FIG. 3 illustrates how the segments could be ordered according to the present invention if printing is done left to right by printing device 130. In this example, the print host 150 has ordered the segments for transmission in the sequence of C1, M1, Y1, C2, M2, Y2, . . .

Figure 4:
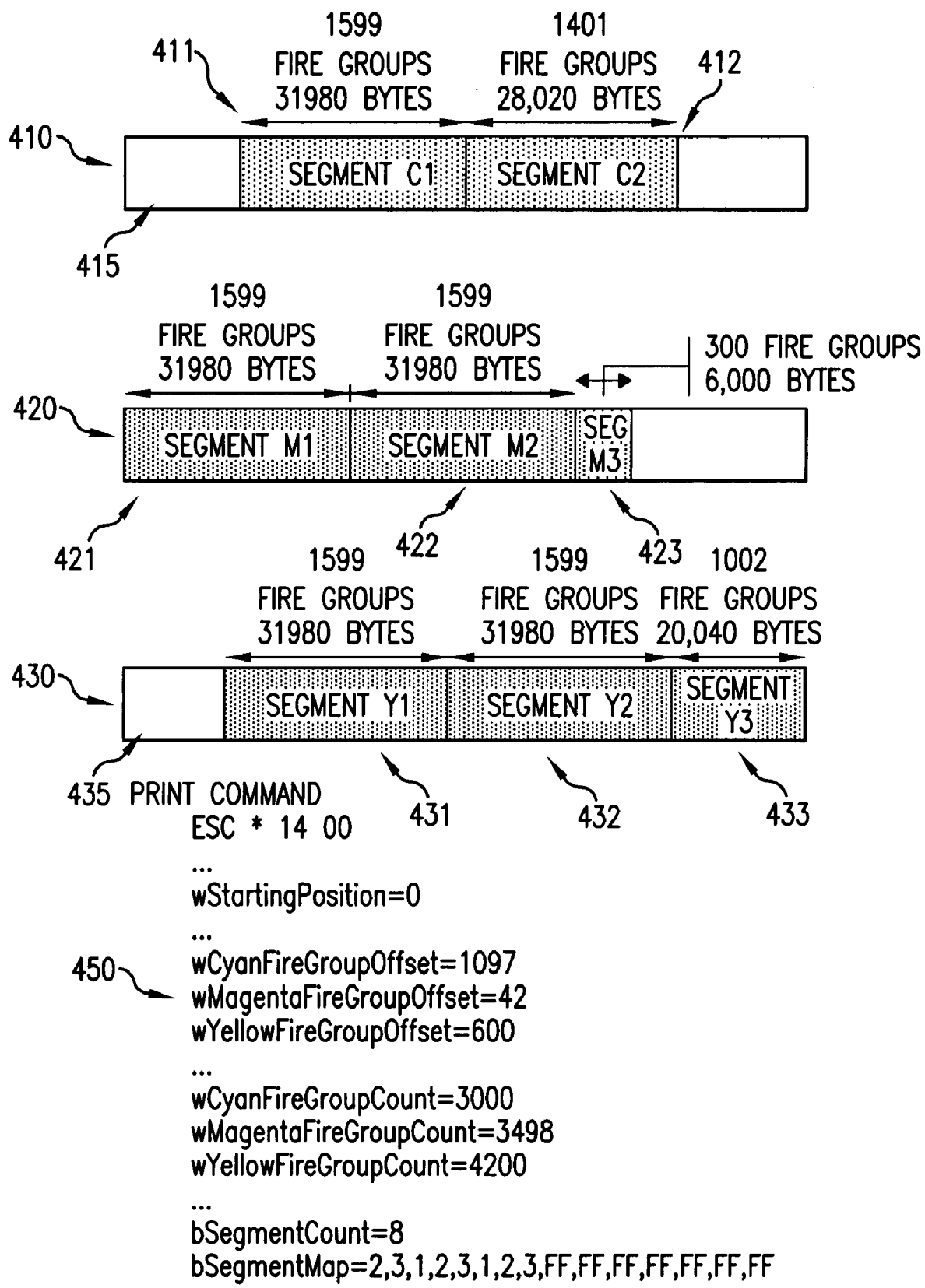
FIG. 4 is an illustration of data streams that contain unequal amounts of print data according to the present invention.

However, practical application of the present invention frequently requires the printing of swaths, which are not composed of equal amounts of each color. Rather, the creation of a swath requires the printing device 130 to apply each color at different points on a page. Referring now to FIG. 4, an example is shown of how data segments may be ordered when each data stream contains unequal amounts of print data. That is, the colors to be applied to produce the print swath start and end at different points in the swath. Assuming left to right printing, the print data needed to produce the swath is broken down into a cyan data stream 410, a magenta stream 420 and a yellow stream 430. The swath to be printed is at first exclusively magenta, then magenta in combination with cyan and yellow. Accordingly, cyan data stream 410 is empty at section 415 and the yellow data stream 430 is empty at section 435. Only magenta data stream 420 contains data at the front section of the stream, as is represented by segment 421. One possible resulting order of the data streams for transmission is M1, Y1, C1, M2, Y2, C2, M3, and Y3. The data-less portions 415 and 435 of data streams 410 and 430 are empty—no padding of the data is required. The printer firmware 140 uses the firegroup count and offset data 450 contained in the print header to calculate the beginning and ending points for application of each color on the page. These numbers describe the starting position of each color as a distance from the starting position (offset) and the amount of data that will be sent for each color (firegroup count). By using these numbers along with the starting position of the swath, the printer firmware 140 can determine when to start firing the printheads and when to send the print data to each colorhead.

Figure 5:
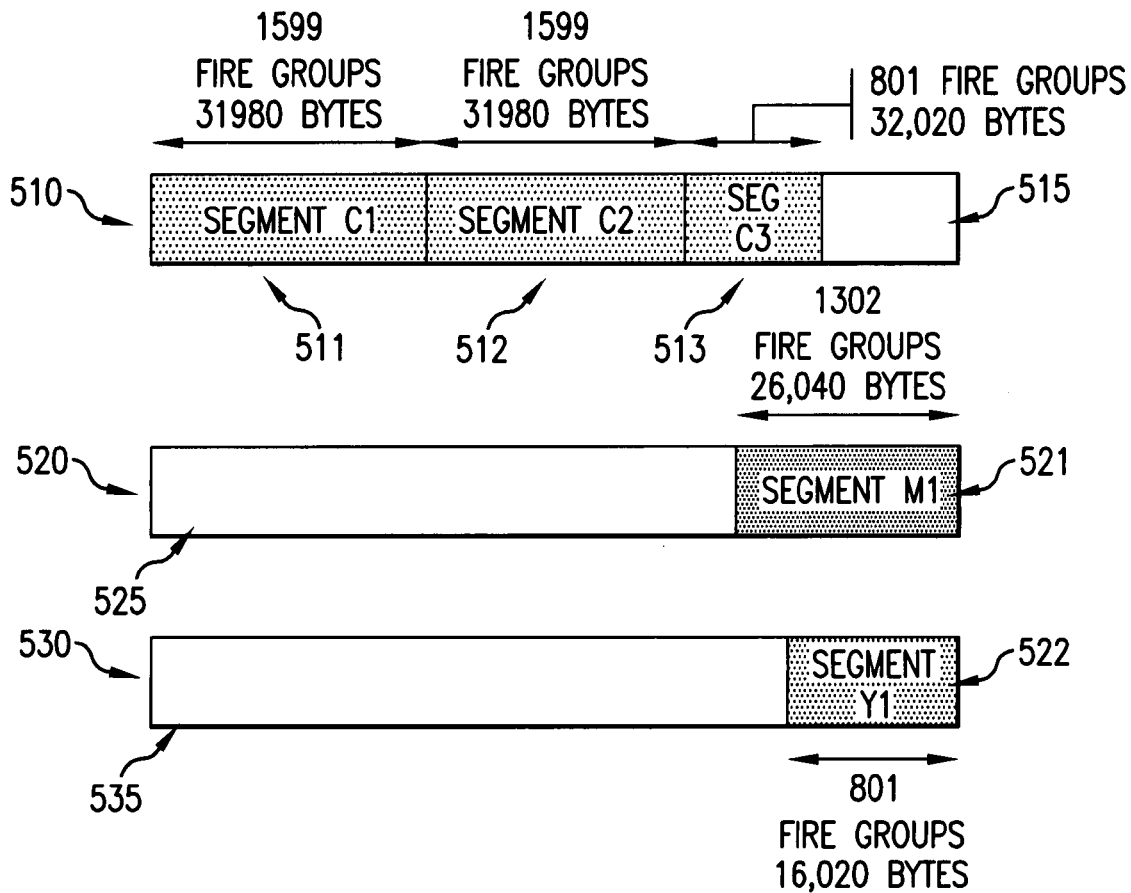
FIG. 5 is an illustration of data streams that contain unequal amounts of print data where two of the streams are mostly empty according to the present invention.

Referring now to FIG. 5, an example of data segment ordering is shown for the situation where multiple data streams are mostly empty. Again, assuming left to right printing, cyan data stream 510 is mostly full and contains three segments 511, 512 and 513. The particular swath to be printed does not require magenta or yellow until near the end of the swath, and thus magenta data stream 520 and yellow data stream 530 are mostly empty at their front sections and contain only single data segments 521 and 522, respectively. In this situation, the segments would be sent in the order C1, C2, C3, M1, and Y1. The empty sections 515, 525 and 535 of each data stream are not padded with zeroes or any other form of placeholder data. Rather, the printer firmware 140 is capable of re-assembling the data segments into streams using the starting position and offset information contained in the print header. FIG. 5 illustrates two significant advantages of the present invention. In this example, where significant portions of two data streams are empty, the lack of a need for data padding substantially reduces the amount of traffic over data link 120. The lack of padding also reduces the amount of memory required in printing device 130 to store print data during processing. Because no memory is expended on storing padding, more print data may be buffered at any one time, creating added economy of memory resources.

Print data is transferred from memory to the printhead(s) of the printing device 130 through direct memory access (DMA). As the printhead passes across the page, it is important that the stream of data to the printhead not be interrupted. According to the present invention, the continuous data stream is accomplished by providing the DMA controller with registers that allow sequential DMA transfers to be set up all at once. When first setting up the DMA to a printhead, the first data segment is setup along with pointers to the second data segment. The system of the present invention automatically switches from the first to the second upon the end of the first data segment. The memory space previously occupied by the first segment is immediately de-allocated for re-use and filled by another segment of print data. The printer firmware 140 then has until the second segment completes to setup pointers for the third segment, and so on. This process continues for every data segment in the swath, so that data segments are continuously pulled from and allocated to printer memory until the print job is complete.

Figure 6:
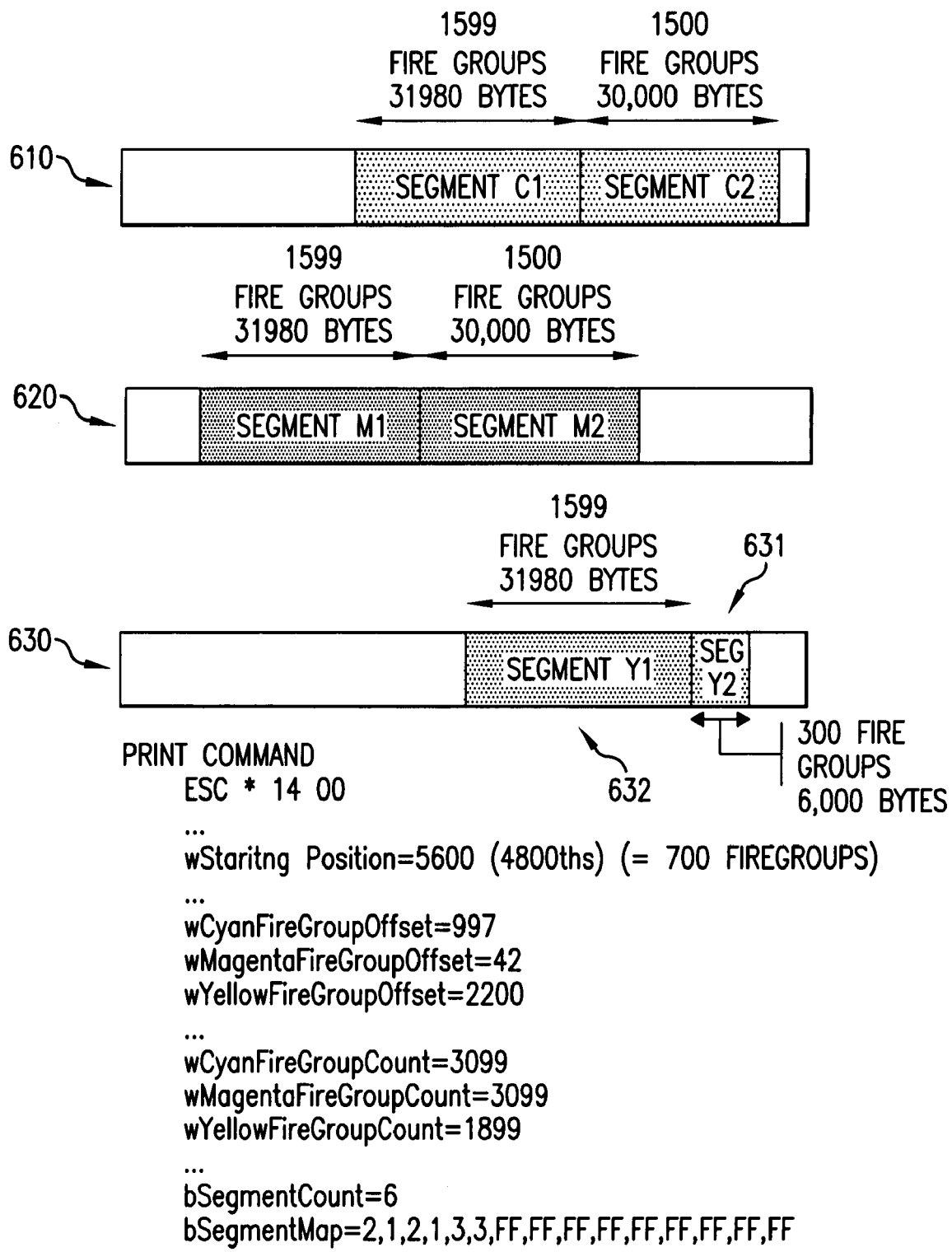
FIG. 6 is an illustration of a data stream that contains a data segment of minimum size according to the present invention.

If a particular data segment is too small, the firmware will not have enough time to setup the pointers for the next segment before all the data from the current segment is transferred to the printhead. To prevent this problem, a minimum segment size must be established such that the time required to transfer the segment is not less than the time needed for the printer firmware 140 to setup the pointers for the next segment. For example, the firmware 140 may need at least 30 milliseconds to set up the next pointer, and that amount of time may require segments to be a minimum of 6000 bytes in size. FIG. 6 illustrates the segmentation of data in yellow data stream 630 into two segments 631 and 632, with each segment meeting the 6000 byte minimum. It will be understood by those in the art that the minimum size of segment can be selected to meet the specific capabilities of the printing device 130 employed.

Figure 7:
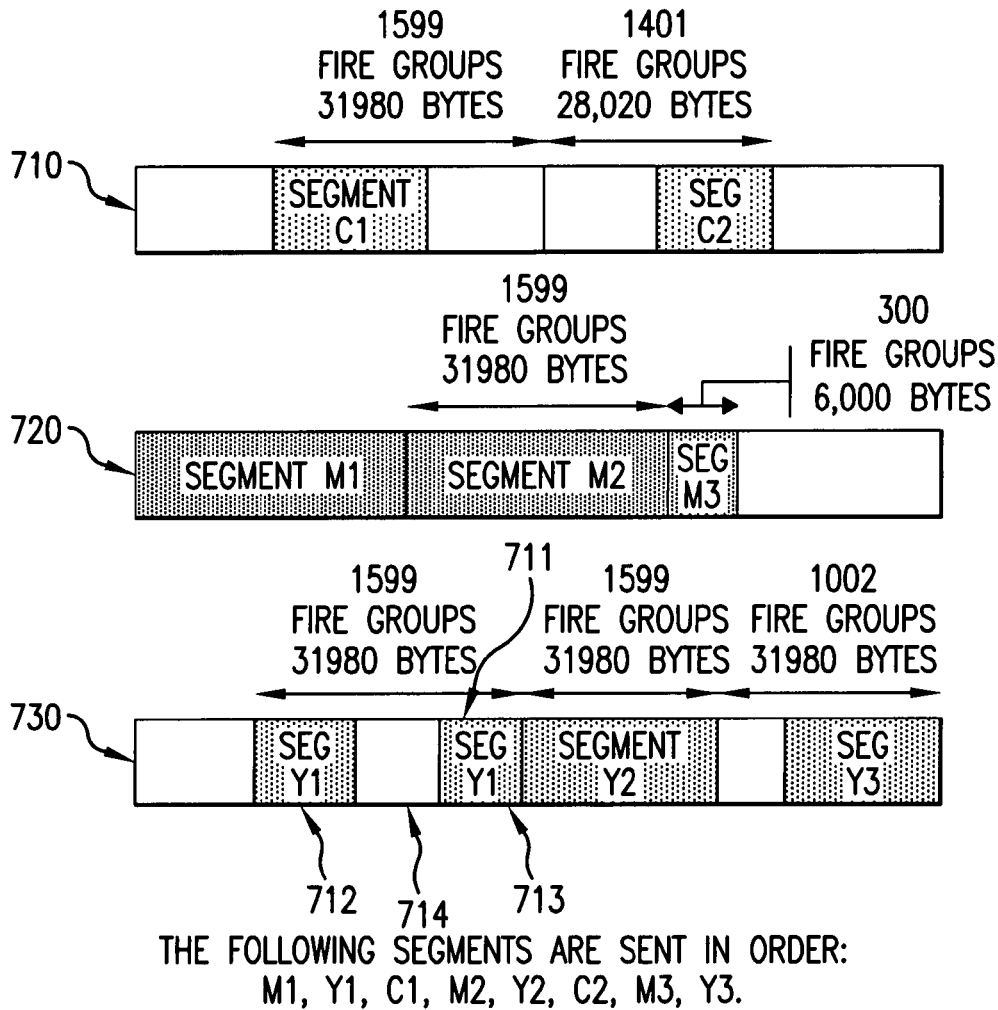
FIG. 7 is an illustration of a data segment that contains non-contiguous print data according to the present invention.

Referring now to FIG. 7, the manner in which segments are created when the print data is not contiguous within the segment is illustrated. A particular swath may require a specific color to be applied for brief interval. If the size of the data for that interval is less than the minimum size established for each segment, then that interval can not be an individual segment. As shown in FIG. 7, data stream 730 contains two non-contiguous intervals of data 712 and 713 that are not of sufficient size themselves to be individual segments. To achieve a segment of sufficient size, intervals 712 and 713 can be joined along with empty interval 714 in a single segment 711. In this situation, segment 711 contains zeroes for the empty interval 714.

Figure 8A:
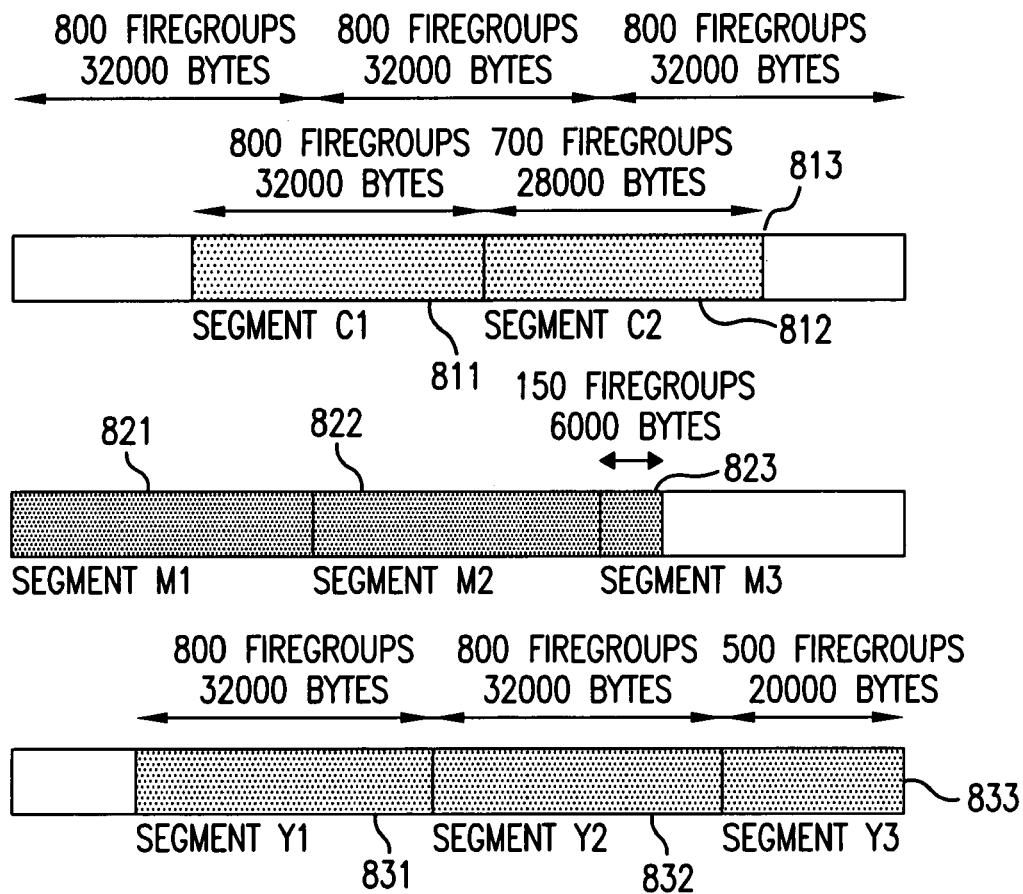
FIG. 8A is an illustration of DMA alignments between data segments according to a first method for the present invention.
Figure 8B:
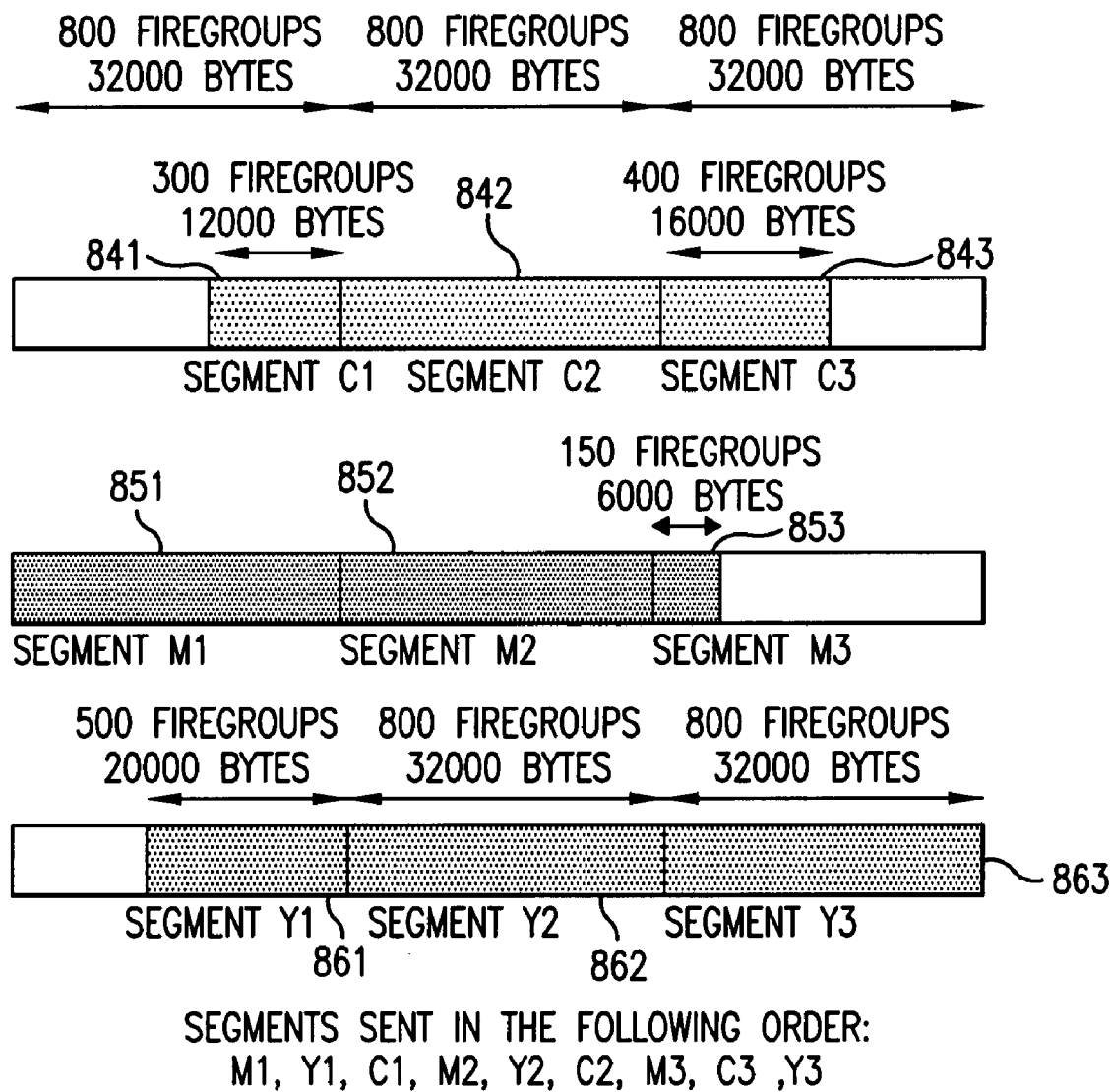
FIG. 8B is an illustration of DMA alignments between data segments according to a second method for the present invention.

Additional benefits can be obtained by aligning the segments with the DMA FIFOs in the printer ASIC so that DMA transfers for all data streams can be completed at one time, lessening the time requirements by reducing the interrupt handler overhead. Referring now to FIGS. 8A and 8B, the advantages of coordinating DMA interrupts are shown by illustrating the consequence of two methods of scheduling DMA interrupts, one without segment alignment and one with segment alignment. In Method 1, illustrated in FIG. 8A, DMA interrupts occur at each segment boundary in each color. So, there are nine DMA interrupts: one at the start of cyan 811, one at the start of 831 yellow, one at segment 812 cyan, two between segments 821 and 822 of magenta, two between segments of yellow (832 and 833), one at the end of 813 cyan, and one at the end of 823 magenta. In Method 2, illustrated in FIG. 8B, DMA interrupts occur at the start and end of colors and at coordinated points in the data streams. Therefore, there are six interrupts in Method 2: one at the start of 841 cyan, one at the start of 861 yellow, two between color segments 862 and 863, one at the end of 843 cyan, and one at the end of 853 magenta. The two interrupts between color segments handle the DMA interrupts for all three colors at the same time. This gives a maximum of six DMA interrupts per swath. By eliminating the number of DMA interrupts, the printer firmware spends less time managing the print DMA system and can use that time for other processing, such as data decompression. Reducing the number of interrupts also eases the burden on the interrupt controller and allows other interrupts in the system more opportunity to be serviced.

As data segments and headers are received by the print device 130, the data must be correctly organized and decompressed for use by the print system. In a preferred embodiment or the present invention, this work is performed by three tasks—a transform task, a decompression task and a command handler task.

Figure 9:
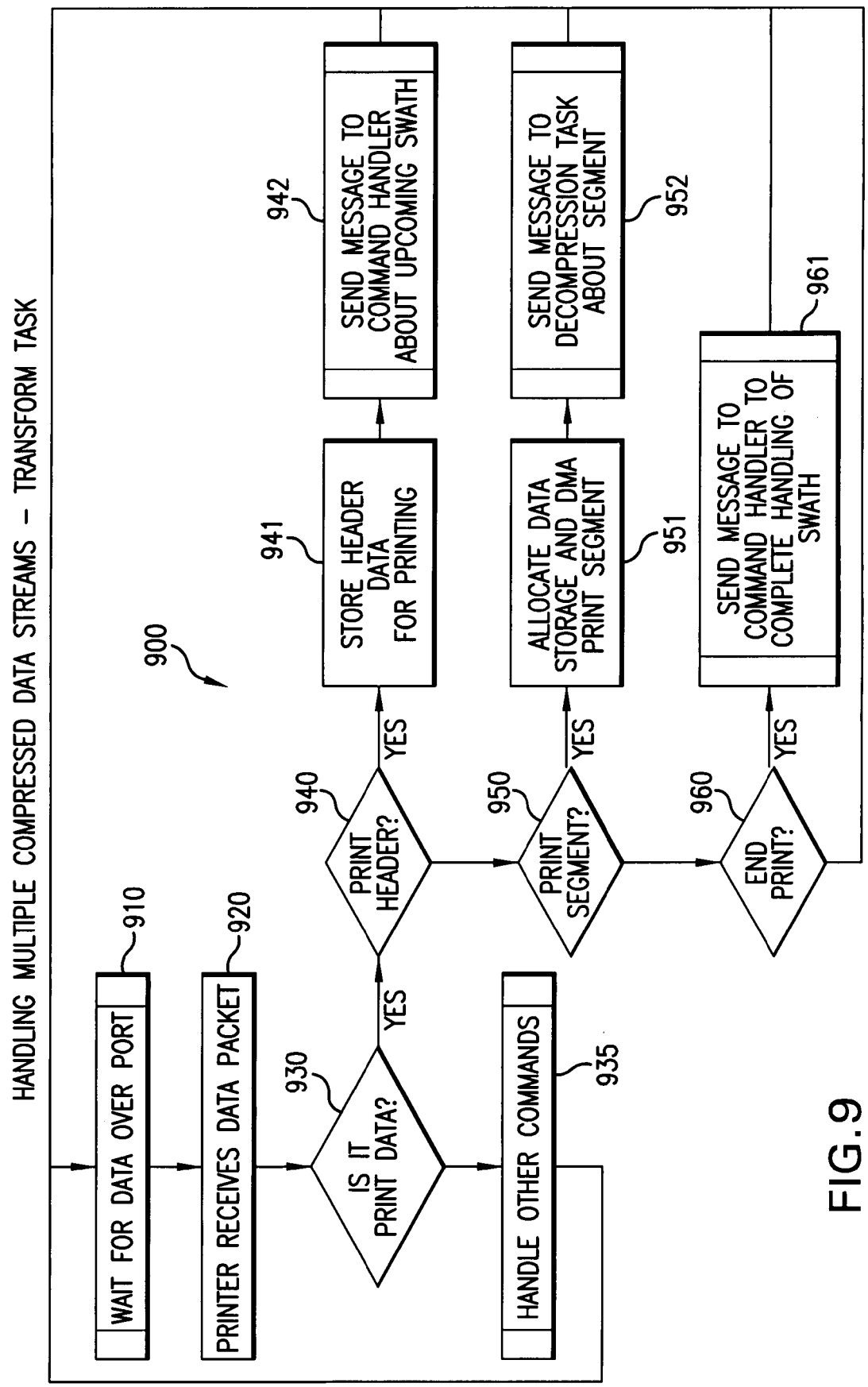
FIG. 9 is a flow chart illustrating the functions of a Transform Task according to the present invention.

Referring now to FIG. 9, the functions performed by a transform task in handling multiple compressed data streams are illustrated in a flow chart. The transform task 900 waits for data to be received at step 910. If print data is received at step 920, the transform task 900 determines whether the data is a print header at step 940, a data segment at step 950, or an end print command at step 960. If the data is a print header, the header is stored at step 941 and a message is sent to the command handler task about the upcoming swath at step 942. If the data is a data segment, the transform task 900 allocates memory space for data storage and DMA data at step 951, then sends a message to the decompression task to decompress the segment at step 952. The transform task allocates a memory partition for each segment that correctly matches the size of the segment using the information contained in the segment header, thus preventing fragmentation of the print device memory. If the data is an end print command, the transform task 900 sends a message to the command handler to complete handling of the swath print data at step 961.

Figure 10:
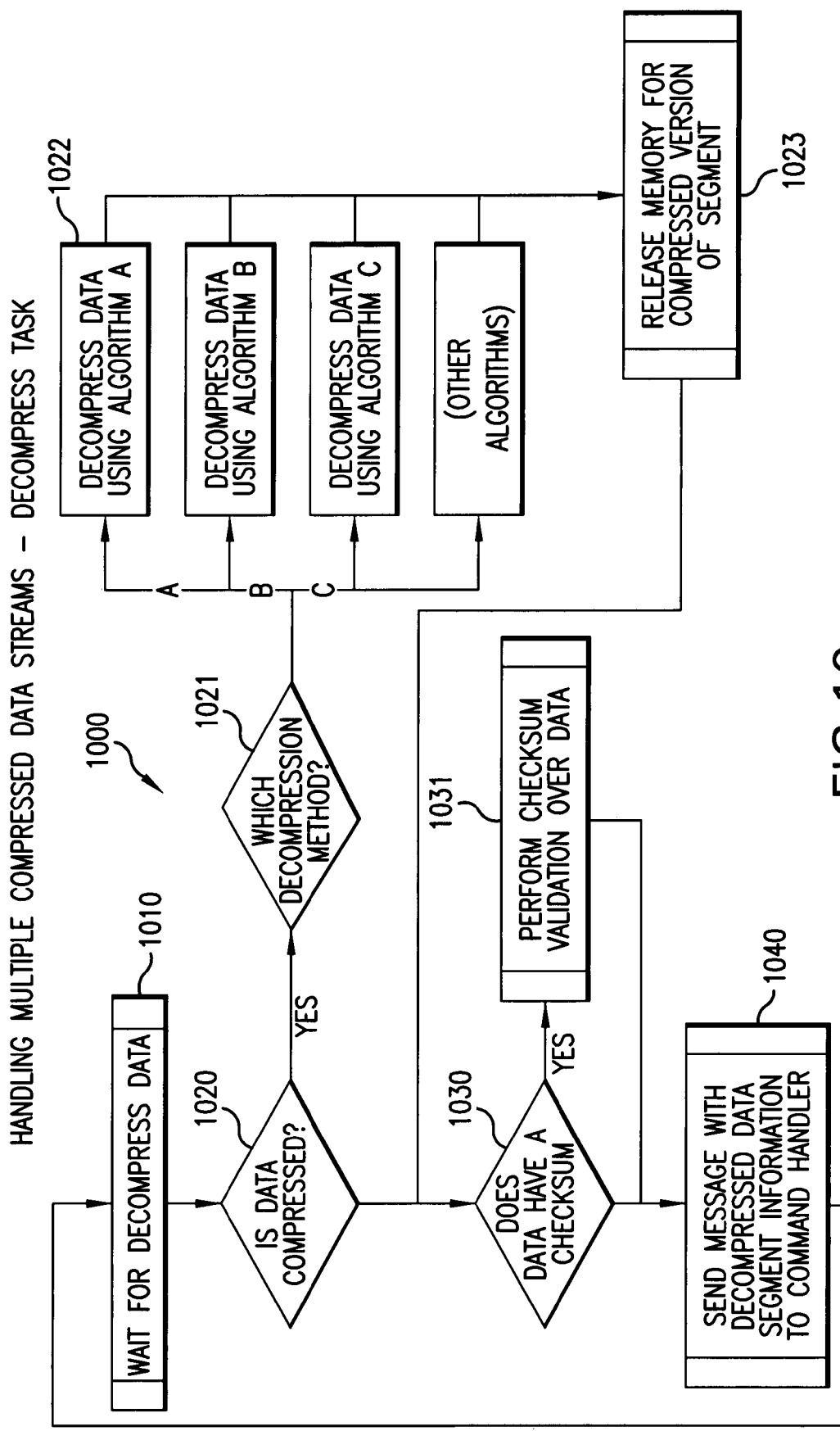
FIG. 10 is a flow chart illustrating the functions of a Decompression Task according to the present invention.

Referring now to FIG. 10, the functions performed by the decompression task are illustrated with a flow chart. The decompression task 1000 waits for a message step 1010. When a data segment is received, decompression task 1000 determines if the data is compressed at step 1020. If the data is compressed, a determination is made as to which compression algorithm is employed at step 1021, and the segment is decompressed using that algorithm at step 1022. Decompression task 1000 also determines if the data has a checksum at step 1030, and if so, performs a checksum validation at step 1031. After decompression and checksum validation, the decompression task 1000 sends a message with a pointer and the size of the processed data segment to the command handler 1040. It will be understood by those in the art that the decompression of data segments may also be performed by printer hardware. In such cases, the printer hardware 160 would perform the above-described functions of the decompression task 1000.

Figure 11:
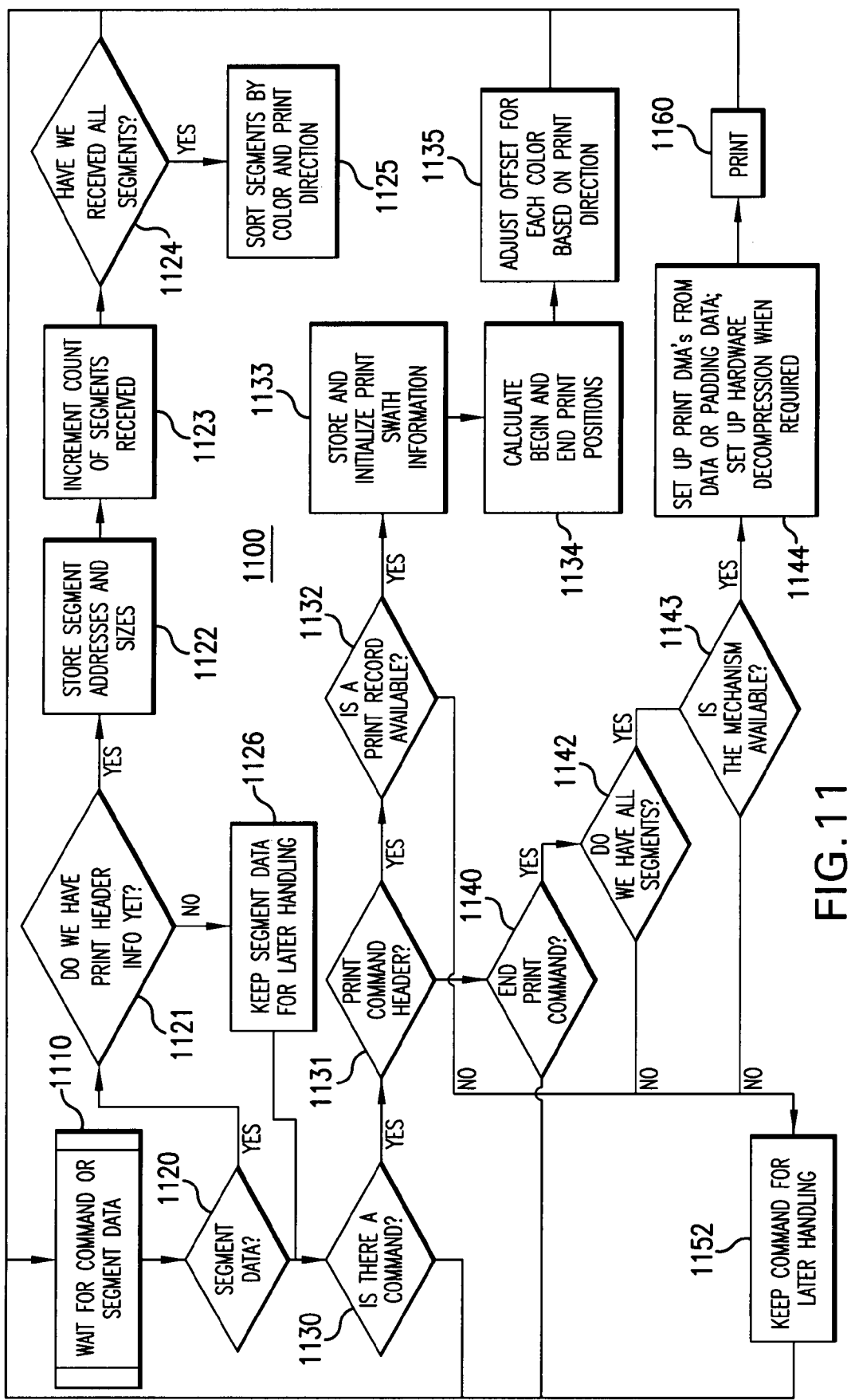
FIG. 11 is a flow chart illustrating the functions of a Command Handler Task according to the present invention.

Referring now to FIG. 11, a flow chart illustrating the functions of a command handler task according to present invention is described. The command task 1100 waits for a command or segment data at step 1110. If segment data is present at step 1120, the command handler 1100 checks for print header information, and if none is present, the segment data is stored for later handling at step 1126. If print header information is present at step 1121, then the command handler stores the memory addresses and sizes of the segments at step 1122 and increments the count of segments received at step 1123. The command handler 1100 determines if all segments have been received at step 1124 and if so, sorts the segments by color and print direction at step 1125.

Concurrently with the segment processing described above, command handler 1100 also checks for a command at step 1130. When a command is received, the command handler determines whether it is a print command at step 1131. If so, a further check is performed for a print record at step 1132, and if the print record is available the information contained in the print record about the print swath is stored and initialized at step 1133. Command handler 1100 uses the information from the print record to calculate the beginning and ending print positions for the swath at step 1134 and to adjust the offset for each color according to the print direction at step 1135.

When a command handler 1100 receives a print command header at step 1131, a further check is performed to determine if the print command header is an end print command at step 1140 that has been sent by the transform task 900. The command handler 1100 determines whether all the data segments have been received at step 1142. Upon receipt of all data segments, the command handler will check the printing mechanism at step 1143, and if the printer is not busy, the command handler 1100 will set up DMAs for the printheads to the print data at step 1144, and then print the swath at step 1160. If all data segments have not been received at step 1142, or if the mechanism is busy at step 1143, the command handler 1100 will store the command for later handling at step 1152.

It will be understood by those having skill in the art that the segmentation and processing techniques disclosed herein significantly improve processing and memory management capabilities for a printing system. The method and system of the present invention provide for dividing print data into separate streams, dividing the data streams into segments, transmitting the segments to a print device and reassembling the segments to produce a printed item. Benefits of the present invention include reducing the amount of memory needed in a print device, preventing fragmentation of print device memory, reducing data traffic over system ports and data links, and improving the overall is efficiency of printing system. Furthermore, it will be understood by those having skill in the art that the segmentation techniques of the present invention can be employed without the use of data compression algorithms, if so desired.

The above-described embodiments are given as an illustrative examples only. It will be readily appreciated that many deviations may be made from the specific embodiment disclosed in this specification without departing from the invention. Accordingly, the scope of the invention is to be determined by the claims below rather than being limited to the specifically described embodiment above.

What is claimed is:

1. A method of transmitting print data from a host to a printing device for processing, comprising the steps of:
   (a) dividing the print data into separate data streams;
   (b) dividing the data streams into data segments;
   (c) compressing the data segments with a compression algorithm;
   (d) creating a print header containing instructions for processing each data segment and embedding within the print header a map detailing the order in which the data segments will be transmitted from the host to the printing device, wherein the print header is embedded within each data segment, the header including information that describes the size of data in the data segment in compressed and uncompressed form;
   (e) sending the print header from the host to a printing device;
   (f) sending the data segments from the host to a printing device;
   (g) decompressing the data segments;
   (h) allocating printer memory space to store the decompressed data segment; and
   (i) processing the decompressed data segments according to the instructions contained in the print header to produce a printed item.

2. The method of claim 1, wherein the step of compressing the data segments is performed using different compression algorithms for different segments.

3. The method of claim 1, where the step of allocating memory for storing decompressed data further comprises the step of allocating memory partitions according to the size of each uncompressed data segment, such that the size of the partition is similar to the size of the decompressed data segment.

4. The method of claim 1, where the step of creating a print header further comprises the step of embedding within the print header information about the relative positions of a color to be applied to a printing medium during the printing process.

5. The method of claim 1, wherein the printing device is an inkjet printer with color capability.

6. The method of claim 5, wherein the step of dividing the print data into streams is performed such that each of the streams contains only print data for one color of ink.

7. The method of claim 6, further comprising the step of calculating the beginning and ending points of application for each color of ink applied to the surface of the printing medium by the printing device during the printing of a swath.

8. A system for processing print data, comprising:
   (a) a print data host, wherein the print data host performs the steps of:
      (i) dividing the print data into separate data streams;
      (ii) dividing the print data streams into data segments;
      (iii) compressing the data segments with a compression algorithm;
      (iv) creating a print header containing instructions for processing each data segment, wherein the print data host embeds a header in each data segment that contains information in the header which describes the size of data in the segment in compressed and uncompressed form and wherein the print header further contains a map detailing the order in which the data segments will be transmitted from the print data host to the printing device;
      (v) sending the print header and data segment from the host to a printing device; and
   (b) a printing device, wherein the printing device performs the steps of:
      (i) decompressing the data segments received from the print data host;
      (ii) allocating printer memory space to store the decompressed data segments; and
      (iii) processing the decompressed data segments according to the instructions contained in the print header to produce a printed item.

9. The system of claim 8, wherein the print data host compresses the data segments using different compression algorithms for different segments.

10. The system of claim 8, wherein the print data host embeds a header in each data segment that describes the compression scheme employed.

11. The system of claim 8, wherein the print data host embeds within the print header information about the relative positions of each color to be applied to a printing medium during the printing process.

12. The system of claim 8, wherein the printing device host allocates memory for storing decompressed data according to the size of each uncompressed data segment, such that the size of the partition is similar to the size of the decompressed data segment.

13. The system of claim 8, wherein the printing device is an inkjet printer with color capability.

14. The system of claim 13, wherein the print data host arranges print data into data streams such that each of the data streams contains data for only one color of ink.

15. The system of claim 14, wherein the printer calculates the beginning and ending points of application for each color of ink applied to the surface of the printing medium by the printing device during the printing of a swath.

16. A method of transmitting print data from a host to a printing device for processing, comprising the steps of:
   (a) dividing the print data into separate data streams;
   (b) dividing the data streams into data segments;
   (c) compressing the data segments with a compression algorithm;
   (d) creating a print header containing instructions for processing each data segment, wherein the print header is embedded within each data segment, the header including information that describes the size of data in the data segment in compressed and uncompressed form;
   (e) sending the print header from the host to a printing device;
   (f) sending the data segments from the host to a printing device;
   (g) performing DMA interrupts at the start and end of each color in the data streams and at coordinated points in the data streams;
   (h) decompressing the data segments;
   (i) allocating printer memory space to store the decompressed data segment; and
   (j) processing the decompressed data segments according to the instructions contained in the print header to produce a printed item.

17. The method of claim 16, wherein the step of compressing the data segments is performed using different compression algorithms for different segments.

18. The method of claim 16, where the step of allocating memory for storing decompressed data further comprises the step of allocating memory partitions according to the size of each uncompressed data segment, such that the size of the partition is similar to the size of the decompressed data segment.

19. The method of claim 16, where the step of creating a print header further comprises the step of embedding within the print header information about the relative positions of a color to be applied to a printing medium during the printing process.

20. The method of claim 16, wherein the printing device is an inkjet printer with color capability.

21. The method of claim 20, wherein the step of dividing the print data into streams is performed such that each of the streams contains only print data for one color of ink.

22. The method of claim 21, further comprising the step of calculating the beginning and ending points of application for each color of ink applied to the surface of the printing medium by the printing device during the printing of a swath.

23. The method of claim 16, wherein the step of creating a print header further comprises the step of embedding within the print header a map detailing the order in which the data segments will be transmitted from the host to the printing device.

24. A computer program product encoded in a computer readable medium, the program product encoded for transmitting print data from a host to a printing device for processing, the program product encoded to perform the steps of:
 (a) dividing the print data into separate data streams;
 (b) dividing the data streams into data segments;
 (c) compressing the data segments with a compression algorithm;
 (d) creating a print header containing instructions for processing each data segment and embedding within the print header a map detailing the order in which the data segments will be transmitted from the host to the printing device, wherein the print header is embedded within each data segment, the header including information that describes the size of data in the data segment in compressed and uncompressed form;
 (e) sending the print header from the host to a printing device;
 (f) sending the data segments from the host to a printing device;
 (g) decompressing the data segments;
 (h) allocating printer memory space to store the decompressed data segment; and
 (i) processing the decompressed data segments according to the instructions contained in the print header to produce a printed item.

25. The method of claim 24, wherein the step of compressing the data segments is performed using different compression algorithms for different segments.

26. The method of claim 24, where the step of allocating memory for storing decompressed data further comprises the step of allocating memory partitions according to the size of each uncompressed data segment, such that the size of the partition is similar to the size of the decompressed data segment.

27. The method of claim 24, where the step of creating a print header further comprises the step of embedding within the print header information about the relative positions of a color to be applied to a printing medium during the printing process.

28. The method of claim 24, wherein the printing device is an inkjet printer with color capability.

29. The method of claim 24, wherein the step of dividing the print data into streams is performed such that each of the streams contains only print data for one color of ink.

30. A computer program product encoded in a computer readable medium, the program product encoded for transmitting print data from a host to a printing device for processing, the program product encoded to perform the steps of:
 (a) dividing the print data into separate data streams;
 (b) dividing the data streams into data segments;
 (c) compressing the data segments with a compression algorithm;
 (d) creating a print header containing instructions for processing each data segment, wherein the print header is embedded within each data segment, the header including information that describes the size of data in the data segment in compressed and uncompressed form;
 (e) sending the print header from the host to a printing device;
 (f) sending the data segments from the host to a printing device;
 (g) performing DMA interrupts at the start and end of each color in the data streams and at coordinated points in the data streams;
 (h) decompressing the data segments;
 (i) allocating printer memory space to store the decompressed data segment; and
 (j) processing the decompressed data segments according to the instructions contained in the print header to produce a printed item.

31. The method of claim 30, where the step of creating a print header further comprises the step of embedding within the print header information about the relative positions of a color to be applied to a printing medium during the printing process.

32. The method of claim 30, wherein the printing device is an inkjet printer with color capability.

* * * * *